US012622159B2

(12) United States Patent
Hamade

(10) Patent No.: US 12,622,159 B2
(45) Date of Patent: May 5, 2026

(54) DISPLAY DEVICE AND ELECTRONIC APPARATUS

(71) Applicant: SEIKO EPSON CORPORATION, Tokyo (JP)

(72) Inventor: Yuiga Hamade, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 380 days.

(21) Appl. No.: 18/239,885

(22) Filed: Aug. 30, 2023

(65) Prior Publication Data

US 2024/0074292 A1     Feb. 29, 2024

(30) Foreign Application Priority Data

Aug. 31, 2022     (JP) ................................. 2022-137921

(51) Int. Cl.
H10K 59/35          (2023.01)
H10K 59/80          (2023.01)
H10K 102/00          (2023.01)

(52) U.S. Cl.
CPC ..... H10K 59/878 (2023.02); H10K 59/80524 (2023.02); H10K 2102/351 (2023.02)

(58) Field of Classification Search
CPC ........................ H10K 59/878; H10K 59/80524
USPC ................................................ 313/498–512
See application file for complete search history.

(56) References Cited

U.S. PATENT DOCUMENTS

| | | | |
|---|---|---|---|
| 5,554,911 | A | 9/1996 | Nakayama et al. |
| 2020/0035937 | A1* | 1/2020 | Wu ........................ H10K 50/11 |
| 2020/0212130 | A1* | 7/2020 | Kim ..................... H10K 59/123 |
| 2022/0130924 | A1 | 4/2022 | Takahashi et al. |

FOREIGN PATENT DOCUMENTS

| | | | | |
|---|---|---|---|---|
| CN | 119865941 A | * | 4/2022 | ............. H05B 33/14 |
| CN | 117461400 A | * | 1/2024 | ........... H10K 59/878 |
| JP | 2797883 B2 | | 9/1998 | |
| JP | 2012-248433 A | | 12/2012 | |
| JP | 2012-252822 A | | 12/2012 | |
| JP | 2013-008515 A | | 1/2013 | |
| JP | 2013-058447 A | | 3/2013 | |
| JP | 2019-179716 A | | 10/2019 | |
| JP | 2022-069135 A | | 5/2022 | |

* cited by examiner

*Primary Examiner* — Christopher M Raabe
(74) *Attorney, Agent, or Firm* — Oliff PLC

(57)          ABSTRACT

A display device includes: an organic layer including a light-emitting layer, the light-emitting layer including an organic light-emitting material; a reflective layer configured to reflect light generated at the light-emitting layer; a first electrode that is transparent; a second electrode that is transparent; and an optical adjustment layer configured to adjust an optical distance between the reflective layer and the second electrode. The reflective layer, the optical adjustment layer, the first electrode, the organic layer, and the second electrode are arranged in order. A reflectance of a first interface between the organic layer and the first electrode and a reflectance of a second interface between the organic layer and the second electrode are each 11% or less.

8 Claims, 6 Drawing Sheets

DISPLAY DEVICE AND ELECTRONIC APPARATUS

The present application is based on, and claims priority from JP Application Serial Number 2022-137921, filed Aug. 31, 2022, the disclosure of which is hereby incorporated by reference herein in its entirety.

BACKGROUND

1. Technical Field

The present disclosure relates to a display device and an electronic apparatus.

2. Related Art

Devices including light-emitting elements such as organic electroluminescence (EL) elements are known.

JP-A-2013-8515 discloses an organic EL element used in an organic EL light-emitting device. The organic EL element includes a substrate, a reflective layer, an optical path length adjustment layer, a first electrode, an organic EL layer, and a second electrode. The substrate, the reflective layer, the optical path length adjustment layer, the first electrode, the organic EL layer, and the second electrode are layered in order from the substrate.

Also, in the organic EL element described in JP-A-2013-8515, the optical path length adjustment layer, the first electrode, and the organic EL layer constitute a resonator structure. In addition, the optical path length adjustment layer is provided between the reflective layer and the first electrode to increase an optical path length of the resonator structure.

However, in the device having the resonator structure as described in JP-A-2013-8515, the colors or luminance of display looks different depending on a viewing direction with respect to the device. That is, in the device described in JP-A-2013-8515, there is a problem of reduction in color viewing angle and luminance viewing angle.

SUMMARY

In order to solve the above problems, a display device according to a preferred aspect of the present disclosure includes an organic layer including a light-emitting layer, the light-emitting layer including an organic light-emitting material, a reflective layer configured to reflect light generated at the light-emitting layer, a first electrode being transparent, a second electrode being transparent, and an optical adjustment layer configured to adjust an optical distance between the reflective layer and the second electrode, wherein the reflective layer, the optical adjustment layer, the first electrode, the organic layer, and the second electrode are arranged in order, and a reflectance of a first interface between the organic layer and the first electrode and a reflectance of a second interface between the organic layer and the second electrode are each 11% or less.

DESCRIPTION OF EMBODIMENTS

Figure 1:
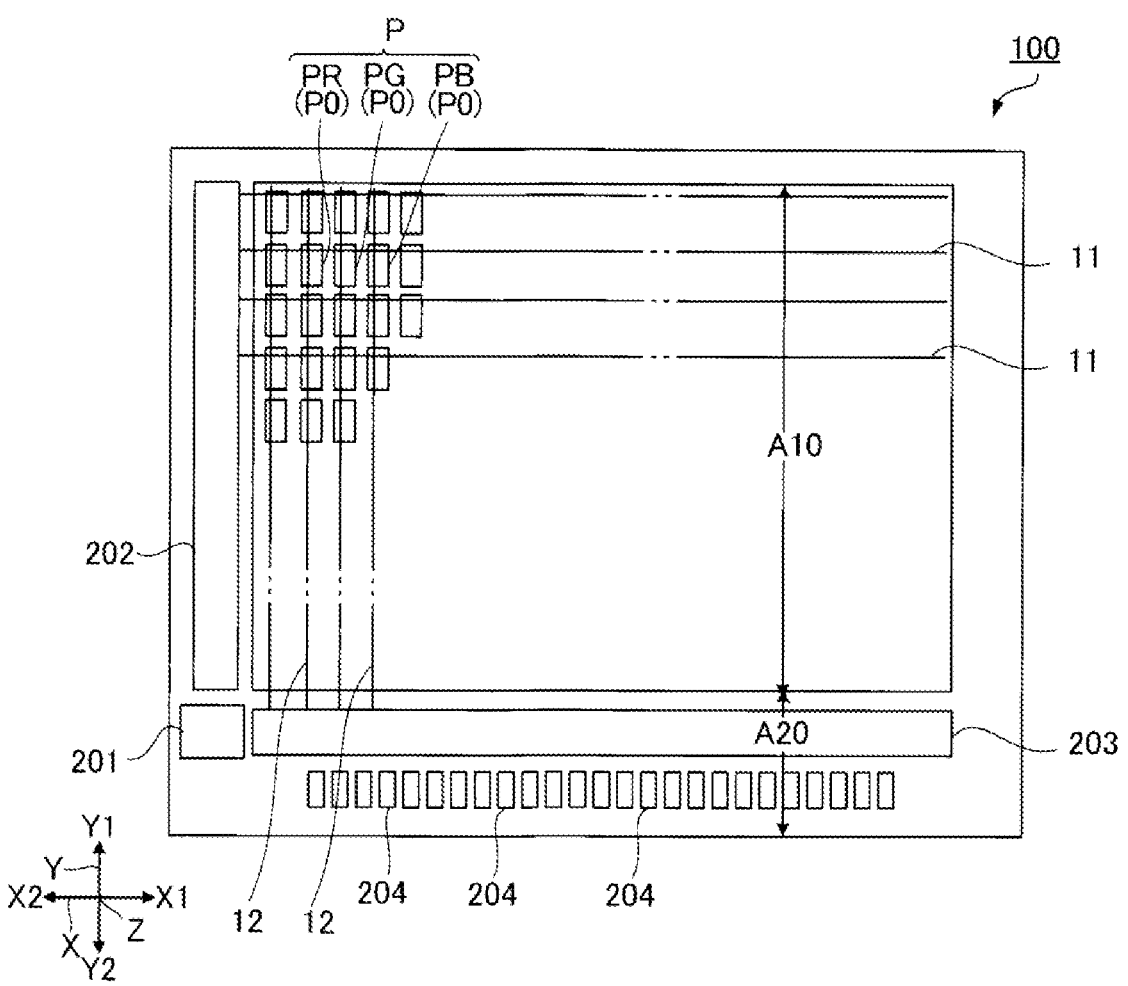
FIG. 1 is a plan view schematically illustrating a display device according to a first embodiment.

Preferred embodiments of the present disclosure will be described below with reference to the accompanying drawings. Note that in the drawings, dimensions and scales of sections differ from actual dimensions and scales as appropriate, and some of the sections are schematically illustrated to make them easily recognizable. Further, the scope of the present disclosure is not limited to these embodiments unless it is otherwise described that the present disclosure in the following description is particularly limited.

1. Display Device 100

1-1. Overall Configuration of Display Device 100

FIG. 1 is a plan view schematically illustrating a display device 100 according to a first embodiment. Note that for convenience of explanation, the description will be made below using an X axis, a Y axis, and a Z axis, which are orthogonal to each other, as appropriate. In addition, one direction along the X axis is defined as an X1 direction, and a direction opposite to the X1 direction is defined as an X2 direction. Similarly, one direction along the Y axis is defined as a Y1 direction, and a direction opposite to the Y1 direction is defined as a Y2 direction. One direction along the Z axis is defined as a Z1 direction, and a direction opposite to the Z1 direction is defined as a Z2 direction. Viewing in the Z1 direction or the Z2 direction is referred to as a "plan view".

The display device 100 illustrated in FIG. 1 displays images using organic electroluminescence (EL). Note that the images include those only displaying character information. Further, the display device 100 is used as a micro display configured to display color images in a head-mounted display, for example. In addition, the head-mounted display will be described later in detail.

The display device 100 is divided into a display region A10 and a peripheral region A20 in plan view. The display region A10 is a region that displays images. The peripheral region A20 is a region in which a peripheral circuit is disposed. The display region A10 has a quadrangular shape. The peripheral region A20 has a quadrangular frame shape surrounding the display region A10.

The display region A10 includes a plurality of pixels P. Each pixel P has a sub-pixel PR from which light in a red wavelength range that is a "first wavelength range" is obtained, a sub-pixel PG from which light in a green wavelength range that is a "second wavelength range" is obtained, and a sub-pixel PB from which light in a blue wavelength range that is a "third wavelength range" is obtained. The red wavelength range exceeds 580 nm and is 700 nm or less. The green wavelength range is 500 nm or greater and 580 nm or less. The blue wavelength range is 400 nm or greater and less than 500 nm. One pixel P of a color image is constituted by the sub-pixel PB, the sub-pixel PG, and the sub-pixel PR. In the following, when the sub-pixel PB, the sub-pixel PG, and the sub-pixel PR are not distinguished from each other, they are expressed as a sub-pixel P0. The sub-pixel P0 is a minimum unit that is independently controlled. A plurality of sub-pixels P0 are disposed in a matrix along the X axis and the Y axis.

Further, in the display region A10, M scanning lines 11 extending along the X axis and N signal lines 12 extending along the Y axis are provided. The plurality of sub-pixels P0 are formed to correspond to each of intersections between the M scanning lines 11 and the N signal lines 12. Note that although not illustrated in detail, a plurality of dummy pixels that do not contribute to image display are provided in a portion of the display region A10 near the peripheral region A20.

The peripheral region A20 is provided with a control circuit 201, a scanning line drive circuit 202, a signal line drive circuit 203, and a plurality of external terminals 204. The control circuit 201 controls display of images. The control circuit 201 generates control signals based on synchronization signals supplied from a higher-level circuit and supplies them to the scanning line drive circuit 202 and the signal line drive circuit 203. Further, the control circuit 201 generates analog image signals based on image data supplied from a higher-level circuit (not illustrated) and supplies them to the signal line drive circuit 203. Also, the scanning line drive circuit 202 is coupled to the M scanning lines 11. The scanning line drive circuit 202 generates scanning signals for sequentially selecting the M scanning lines 11 one by one based on the control signals and outputs them to the M scanning lines 11. In addition, the signal line drive circuit 203 is coupled to the N signal lines 12. The signal line drive circuit 203 generates data signals corresponding to gradations to be displayed based on the image signals and the control signals and outputs them to the N signal lines 12. The external terminals 204 are coupled to a flexible printed circuit (FPC) board or the like (not illustrated) for electrical connection with a higher-level circuit. Further, a power supply circuit (not illustrated) is electrically coupled to the peripheral region A20.

1-2. Electrical Configuration of Display Device 100

Figure 2:
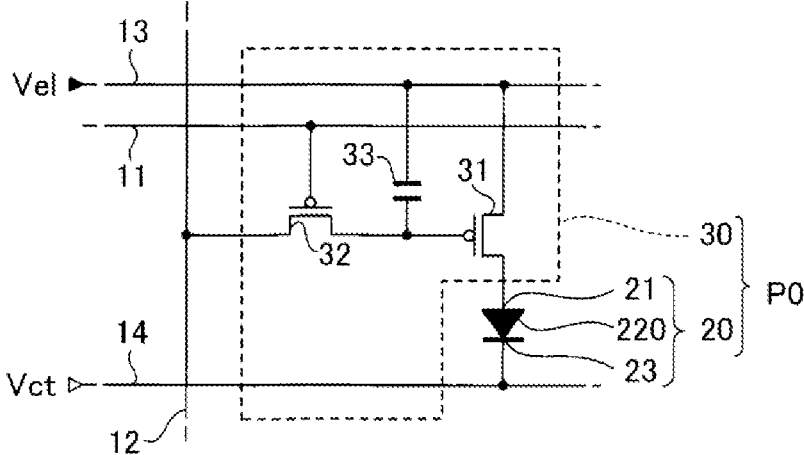
FIG. 2 is an equivalent circuit diagram of a sub-pixel illustrated in FIG. 1.

FIG. 2 is an equivalent circuit diagram of the sub-pixel P0 illustrated in FIG. 1. In FIG. 2, one sub-pixel P0 and elements corresponding thereto are representatively illustrated. As illustrated in FIG. 2, the sub-pixel P0 includes a light-emitting element 20 and a pixel circuit 30.

The light-emitting element 20 is disposed on a path for coupling a first constant potential wiring line 13 to a second constant potential wiring line 14. A power supply potential Vel on a higher potential side is supplied from a power supply circuit (not illustrated) to the first constant potential wiring line 13. A power supply potential Vct on a lower potential side is supplied from the power supply circuit (not illustrated) to the second constant potential wiring line 14. Also, the light-emitting element 20 is constituted by an organic light-emitting diode (OLEO). The light-emitting element 20 includes a light-emitting layer 220, a first electrode 21, and a second electrode 23. The light-emitting layer 220 includes an organic light-emitting material and is interposed between the first electrode 21 and the second electrode 23. The first electrode 21 functions as an anode, and the second electrode 23 functions as a cathode. The first electrode 21 is individually formed for each sub-pixel P0 and is controlled independently from other first electrodes 21. The second electrode 23 is continuous over a plurality of sub-pixels P0. In the light-emitting element 20, holes supplied from the first electrode 21 and electrons supplied from the second electrode 23 are recombined in the light-emitting layer 220. Thus, the light-emitting layer 220 emits light.

The pixel circuit 30 includes a driving transistor 31, a selection transistor 32, and a capacitive element 33. The driving transistor 31 generates a driving current with an amount corresponding to a voltage between a gate and a source or between the gate and a drain. The driving transistor 31 is disposed in series with the light-emitting element 20 on the path for coupling the first constant potential wiring line 13 to the second constant potential wiring line 14. Specifically, one of the source or the drain of the driving transistor 31 is electrically coupled to the first constant potential wiring line 13, and the other is electrically coupled to the first electrode 21.

The selection transistor 32 functions as a switch that controls conduction and non-conduction between the signal line 12 and the gate of the driving transistor 31. A gate of the selection transistor 32 is electrically coupled to the scan line 11. One of a source or a drain of the switching transistor 32 is electrically coupled to the signal line 12, and the other is electrically coupled to the gate of the driving transistor 31.

The capacitive element 33 is a holding capacitor that holds the voltage between the gate and source or between the gate and a drain of the driving transistor 31. One electrode of the capacitive element 33 is coupled to the gate of the driving transistor 31, and the other electrode is coupled to the first constant potential wiring line 13.

In the display device 100, the signal line drive circuit 203 supplies data signals corresponding to the gradations specified for each sub-pixel P0 in parallel to the plurality of signal lines 12 for each writing period. The scanning line drive circuit 202 sequentially selects each of the plurality of scanning lines 11 for each writing period by outputting the scanning signals to the scanning lines 11. When the selection transistor 32 of the sub-pixel P0 corresponding to the scanning line 11 selected by the scanning line drive circuit 202 is turned on, a gradation potential corresponding to the data signal is supplied to the gate of the driving transistor 31, and a voltage corresponding to the gradation potential is held in the capacitive element 33. Accordingly, a driving current corresponding to the gradation potential is supplied from the driving transistor 31 to the light-emitting element 20. In this way, each light-emitting element 20 emits light with luminance corresponding to the gradation potential, and thus arbitrary images specified by the image signals are displayed in the display region A10. Further, even after the writing period ends, the driving current corresponding to the voltage held in the capacitive element 33 is supplied from the driving transistor 31 to the light-emitting element 20. For this reason, each light-emitting element 20 maintains light emission with the luminance corresponding to the gradation potential.

Note that the configuration of the pixel circuit 30 illustrated in FIG. 2 is an example, and a configuration other than the configuration illustrated in FIG. 2 may be adopted. For example, the pixel circuit 30 may further include another transistor that controls conduction between the first electrode 21 and the driving transistor 31.

1-3. Pixel P of Display Device 100

Figure 3:
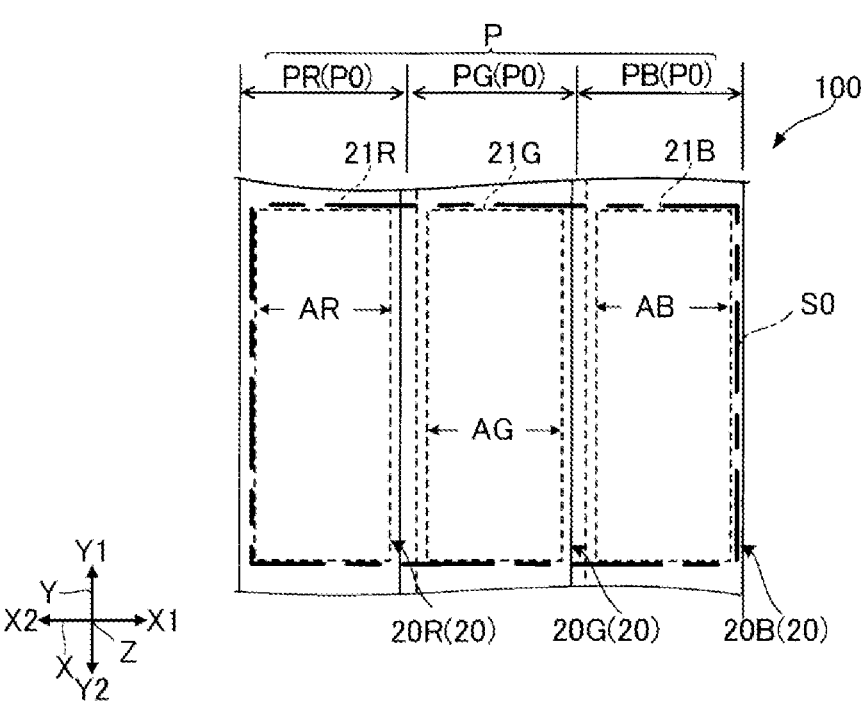
FIG. 3 is a plan view illustrating a part of the display device in FIG. 1.

FIG. 3 is a plan view illustrating a part of the display device 100 in FIG. 1. Note that in the following description, elements of one pixel P are representatively illustrated. In the following, "R" is added to ends of reference numerals of elements related to the sub-pixel PR, "G" is added to ends of reference numerals of elements related to the sub-pixel PG, and "B" is added to ends of reference numerals of elements related to the sub-pixel PB.

As illustrated in FIG. 3, in the display device 100, each pixel P is provided with light-emitting elements 20R, 20G, and 20B. The light-emitting element 20R is a light-emitting element 20 provided in the sub-pixel PR. The light-emitting element 20G is a light-emitting element 20 provided in the sub-pixel PG. The light-emitting element 20B is a light-emitting element 20 provided in the sub-pixel PB.

The light-emitting element 20R includes an opening region AR from which light in a red wavelength range is emitted. The light-emitting element 20G includes an opening region AG from which light in a green wavelength range is emitted. The light-emitting element 20B includes an opening region AB from which light in a blue wavelength range is emitted. Also, as described above, the first electrode 21 is individually formed for each sub-pixel P0. Accordingly, the light-emitting element 20R includes a first electrode 21R. The light-emitting element 20G includes a first electrode 21G. The light-emitting element 20B includes a first electrode 21B.

Note that in FIG. 3, three sub-pixels P0 included in one pixel P are arranged in a stripe shape. However, the arrangement of the sub-pixels P0 is not limited to the stripe shape, and may be a rectangular shape, a delta-shape, or the like. Although one pixel P includes three sub-pixels P0 in FIG. 3, the number of sub-pixels P0 included in one pixel P is not limited to three. For example, one pixel P may include four sub-pixels P0. Also, in the example illustrated in FIG. 3, a shape of each of the opening regions AR, AG, and AB in plan view is a quadrangle, but is not limited thereto, and may be another polygon such as an octagon.

In addition, in the present specification, a pixel size means a size of the pixel P in plan view or a size of the sub-pixel P0 in plan view. In the present embodiment, a plane area of a quadrangular region S0 surrounding the opening regions AR, AG, and AB corresponds to the pixel size of the pixel P. Note that the pixel P has a pixel size of, for example, from $25 \ \mu m^2$ to $100 \ \mu m^2$. The plane area of the opening region AR corresponds to the pixel size of the sub-pixel PR, the plane area of the opening region AG corresponds to the pixel size of the sub-pixel PG, and the plane area of the opening region AB corresponds to the pixel size of the sub-pixel PB.

1-4. Partial Configuration of Display Device 100

Figure 4:
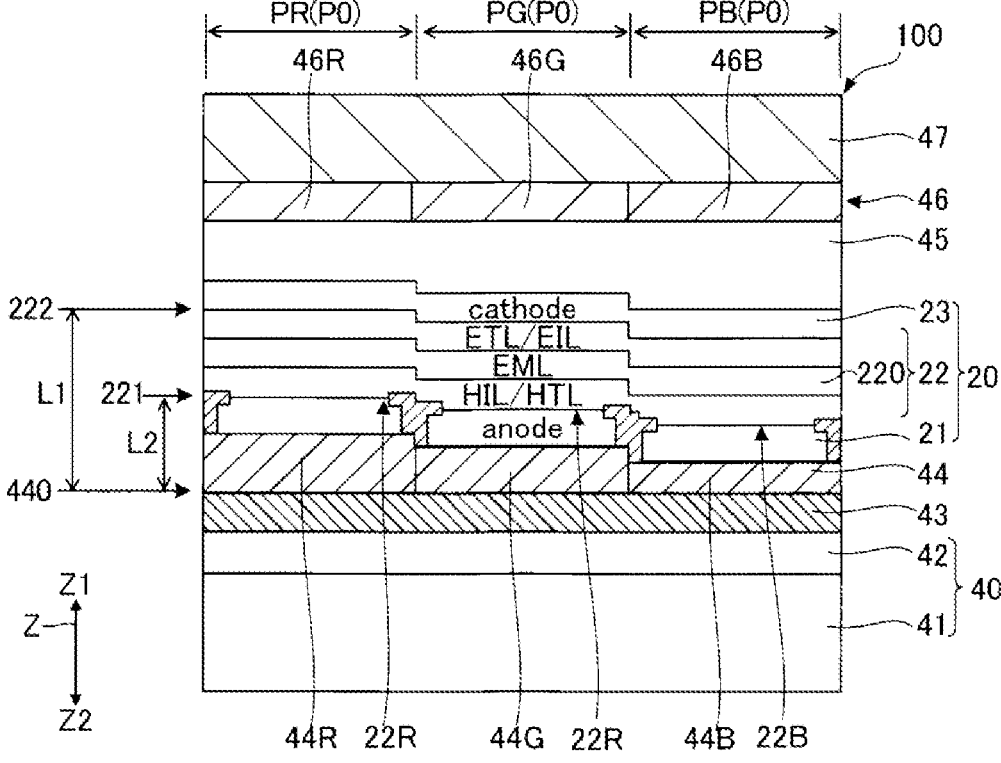
FIG. 4 is a diagram schematically illustrating a partial cross-section of the display device in FIG. 1.

FIG. 4 is a diagram schematically illustrating a partial cross-section of the display device 100 in FIG. 1. In FIG. 4, elements of one pixel P are representatively illustrated.

As illustrated in FIG. 4, the display device 100 includes a substrate 41, a circuit layer 42, a reflective layer 43, an optical adjustment layer 44, a first electrode 21, an organic layer 22, a second electrode 23, a sealing film 45, a color filter 46, and a cover 47. The organic layer 22 includes the above-described light-emitting layer 220. Also, the substrate 41 and the circuit layer 42 form a wiring substrate 40. In addition, the circuit layer 42, the reflective layer 43, the optical adjustment layer 44, the first electrode 21, the organic layer 22, the second electrode 23, the sealing film 45, the color filter 46, and the cover 47 are layered in order from the substrate 41.

The substrate 41 is made of a semiconductor material such as silicon, for example. In the present embodiment, the display device 100 has a top emission structure in which light is emitted in the Z1 direction, and thus the substrate 41 does not need to have light transmissive property. Note that instead of the silicon substrate, for example, a glass substrate, a resin substrate, or a ceramics substrate may be used. Also, the substrate 41 may have a light transmissive property. Note that in the present specification, the term "light transmissive property" indicates a transmissive property with respect to visible light, and the transmittance of visible light may be 50% or greater.

The pixel circuit 30 described above is formed in the circuit layer 42. Specifically, the circuit layer 42 includes a plurality of insulating layers made of silicon oxide or the like, and each element and various wiring lines included in the pixel circuit 30 are formed between the plurality of insulating layers. Examples of materials for the elements and wiring lines of the pixel circuit 30 include, for example, conductive materials such as polysilicon, metals, metal silicide, and metal compounds. Note that although not illustrated in detail, each transistor described above included in the pixel circuit 30 may be any one of a MOS transistor, a thin film transistor, or a field effect transistor. When the transistor included in the pixel circuit 30 is a MOS transistor including an active layer, the active layer may be formed at the substrate 41. Accordingly, a part of the pixel circuit 30 may be formed at the substrate 41.

The reflective layer 43 has light reflectivity and reflects light generated at the light-emitting layer 220. A material of the reflective layer 43 is, for example, a high reflective metal such as aluminum (Al) and silver (Ag) or an alloy thereof. Note that the reflective layer 43 may be constituted by one metal layer or may be a laminate including a plurality of metal layers. Further, the reflective layer 43 may be common to the three sub-pixels P0 or may be provided for each sub-pixel P0. In addition, the reflective layer 43 may have a function of a wiring line electrically coupled to the pixel circuit 30.

The optical adjustment layer 44 has a light transmissive property and adjusts an optical distance between the reflective layer 43 and the light-emitting layer 220. The optical adjustment layer 44 includes a first optical adjustment portion 44R, a second optical adjustment portion 44G, and a third optical adjustment portion 44B. The first optical adjustment portion 44R is provided in the sub-pixel PR. The second optical adjustment portion 44G is provided in the sub-pixel PG. The third optical adjustment portion 44B is provided in the sub-pixel PB.

The thickness of the optical adjustment layer 44 is not particularly limited, and is 50 nm or greater and 500 nm or less. In addition, the optical adjustment layer 44 has a different thickness for each emission color. Specifically, the longer the wavelength is, the thicker the thickness of the optical adjustment layer 44 is. Accordingly, thicknesses of the first optical adjustment portion 44R, a second optical adjustment portion 44G, and a third optical adjustment portion 44B are in descending order of thickness.

A material of the optical adjustment layer 44 is, for example, silicon oxide, silicon oxynitride, or silicon nitride. The optical adjustment layer 44 may be constituted by one layer or may be a laminate of a plurality of layers. For example, when the optical adjustment layer 44 is a laminate, the optical adjustment layer 44 is constituted by a laminate of silicon oxide and silicon nitride.

The first electrode 21 is a transparent pixel electrode and is provided for each sub-pixel P0. In the present specification and the like, the term "transparent" indicates that a reflectance to visible light is 20% or less. A material of the first electrode 21 is a transparent conductive material such as indium tin oxide (ITO) or indium zinc oxide (IZO), for example. The thickness of the first electrode 21 is not particularly limited, and is 10 nm or greater and 200 nm or less, for example. Also, the thickness of the first electrode 21 may be different for each sub-pixel P0, or may be the same.

The organic layer 22 includes at least the light-emitting layer 220. The light-emitting layer 220 contains an organic light-emitting material that emits light when supplied with a current. The organic light-emitting material is a light-emitting organic compound. In the present embodiment, the light-emitting layer 220 includes a layer containing a blue light-emitting material, a layer containing a green light-emitting material, and a layer containing a red light-emitting material. Blue light is generated from the layer containing the blue light-emitting material, green light is generated from the layer containing the green light-emitting material, and red light is generated from the layer containing the red light-emitting material. The organic layer 22 realizes white light emission by including the light-emitting layer 220 in which each emission color of blue, green, and red is obtained. Further, in the present embodiment, in addition to the light-emitting layer 220, a hole injection layer (HIL), a hole transport layer (HTL), an electron injection layer (EIL), and an electron transport layer (ETL) are provided. In the organic layer 22, holes injected from the hole injection layer and electrons transported from the electron transport layer are recombined in the light-emitting layer 220. In addition, each layer of the organic layer 22 is formed by, for example, a vapor deposition method. Note that any configuration may be used for the configuration of the organic layer 22, and any of the layers described above may be omitted from the organic layer 22, or any layer may be further added.

The light-emitting layer 220 includes a first light-emitting portion 22R, a second light-emitting portion 22G, and a third light-emitting portion 22B. The first light-emitting portion 22R emits light in a wavelength range including light in a red wavelength range, which is "light in a first wavelength range". The second light-emitting portion 22G emits light in a wavelength range including a green wavelength range, which is a "second wavelength range" longer than the first wavelength range. The third light-emitting portion 22B emits light in a wavelength range including a blue wavelength range, which is a "third wavelength range" longer than the second wavelength range. Also, although not illustrated in detail, the first light-emitting portion 22R corresponds to the first optical adjustment portion 44R and overlaps the first optical adjustment portion 44R in plan view. The second light-emitting portion 22G corresponds to the second optical adjustment portion 44G and overlaps the second optical adjustment portion 44G in plan view. The third light-emitting portion 22B corresponds to the third optical adjustment portion 44B and overlaps the third optical adjustment portion 44B in plan view.

The second electrode 23 is a common electrode commonly provided for the plurality of sub-pixels P0. Also, the second electrode 23 is a transparent electrode like the first electrode 21. A material of the second electrode 23 is, for example, a transparent conductive material such as ITO and IZO. The thickness of the second electrode 23 is not particularly limited, and is 10 nm or greater and 200 nm or less, for example.

A reflectance of a first interface 221 between the organic layer 22 and the first electrode 21 and a reflectance of a second interface 222 between the organic layer 22 and the second electrode 23 are each 11% or less. Further, each of the first electrode 21 and the second electrode 23 is transparent. For this reason, the display device 100 includes no optical resonator between the reflective layer 43 and the second electrode 23.

Note that the reflectance of the first interface 221 is specifically a reflectance of light traveling from the organic layer 22 toward the first interface 221. Further, the reflectance of the second interface 222 is specifically a reflectance of light traveling from the organic layer 22 toward the second interface 222. In addition, the first interface 221 and the second interface 222 have unevenness because the thickness of the optical adjustment layer 44 is different for each sub-pixel P0.

The sealing film 45 seals the light-emitting element 20. By providing the sealing film 45, the light-emitting element 20 can be protected from moisture or the like in the atmosphere. Also, the sealing film 45 functions as a planarization film that planarizes an upper surface of the light-emitting element 20. Accordingly, the upper surface of the sealing film 45 is flat. Further, the sealing film 45 has a light transmissive property. A material of the sealing film 45 is, for example, silicon oxide, silicon oxynitride, or silicon oxide. The thickness of the sealing film 45 is not particularly limited, and is 10 nm or greater and 2000 nm or less, for example. In addition, the sealing film 45 may be constituted by one layer or a plurality of layers.

The color filter 46 selectively transmits light in a predetermined wavelength range. The color filter 46 includes a colored layer 46R, a colored layer 46G, and a colored layer 46B. The colored layer 46R is provided in the sub-pixel PR and selectively transmits the light in the red wavelength range among the light from the light-emitting element 20R. The colored layer 46G is provided in the sub-pixel PG and selectively transmits the light in the green wavelength range among the light from the light-emitting element 20G. The colored layer 46B is provided in the sub-pixel PB and selectively transmits the light in the blue wavelength range among the light from the light-emitting element 20B. By providing the color filter 46, color purity of the light emitted from each sub-pixel P0 can be improved as compared to a case in which the color filter 46 is not provided. A material of the color filter 46 is, for example, a resin material such as an acrylic photosensitive resin material containing a coloring material. Note that the coloring material is a pigment or a dye.

The cover 47 is bonded to the color filter 46 via, for example, an adhesive layer (not illustrated). The adhesive layer is, for example, a transparent adhesive using a resin material such as an epoxy resin or an acrylic resin. The cover 47 protects each element provided below the cover 47, particularly the light-emitting element 20 and the color filter 46. The cover 47 is constituted by, for example, a glass substrate or a quartz substrate.

As described above, the display device 100 includes the organic layer 22 including the light-emitting layer 220, the reflective layer 43, the optical adjustment layer 44, the first electrode 21, and the second electrode 23. Also, each of the first electrode 21 and the second electrode 23 is transparent. In addition, the reflectance of the first interface 221 between the organic layer 22 and the first electrode 21 and the reflectance of the second interface 222 between the organic layer 22 and the second electrode 23 are each 11% or less. For this reason, the light emitted from the light-emitting layer 220 does not resonate between the reflective layer 43 and the second electrode 23. That is, as described above, the display device 100 includes no optical resonator.

When an optical resonator is provided, light extraction efficiency and color purity are increased in some cases. However, when an optical resonator is provided, forward characteristics of the display device 100 are improved but are highly angle-dependent, and a color change and a luminance change when a viewing direction with respect to the display device 100 is changed tend to be larger. On the other hand, since the display device 100 of the present embodiment includes no optical resonator, it is possible to reduce the color change and the luminance change when the viewing direction is changed. That is, a decrease in color viewing angle and luminance viewing angle can be suppressed.

Further, the display device 100 includes the optical adjustment layer 44 that adjusts the optical distance between the reflective layer 43 and the light-emitting layer 220. For this reason, the light extraction efficiency can be increased and the color purity can be improved.

Figure 5:
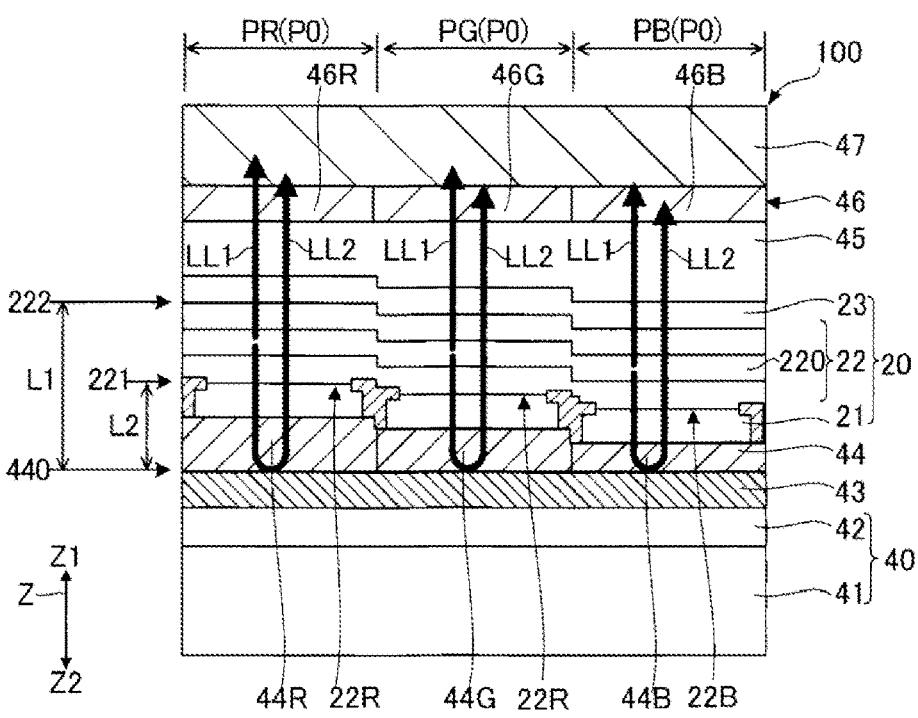
FIG. 5 is a diagram for explaining a path of light in the display device in FIG. 4.

FIG. 5 is a diagram for explaining a path of light in the display device 100 in FIG. 4. As described above, the optical distance between the reflective layer 43 and the light-emitting layer 220 is adjusted by providing the optical adjustment layer 44. Further, light LL1 emitted by the light-emitting layer 220 constructively interferes with light LL2 reflected by the reflective layer 43. In other words, the optical adjustment layer 44 is provided such that the light LL1 constructively interferes with the light LL2 reflected by the reflective layer 43. Note that the light LL1 is light emitted from the light-emitting layer 220 toward the cover 47. The light LL2 is light emitted from the light-emitting layer 220 toward the reflective layer 43, then reflected by the reflective layer 43, and directed toward the cover 47. By aligning phases of the light LL1 and the light LL2, the light extraction efficiency can be increased and the color purity can be improved. In other words, since light of a necessary color can be efficiently extracted and light of an unnecessary color becomes relatively weak, the color purity can be improved. For this reason, a wide color gamut can be realized.

Also, as described above, in the present embodiment, the display device 100 can display color images, and the thickness of the optical adjustment layer 44 is adjusted for each emission color. Specifically, the thicknesses of the first optical adjustment portion 44R, the second optical adjustment portion 44G, and the third optical adjustment portion 44B are different from each other. In the present embodiment, the thicknesses of the first optical adjustment portion 44R, the second optical adjustment portion 44G, and the third optical adjustment portion 44B are in descending order of thickness. When the thicknesses are in the above descending order of thickness, the light extraction efficiency can be effectively increased for each emission color, and the color purity can be improved.

Note that when the thicknesses of the first optical adjustment portion 44R, the second optical adjustment portion 44G, and the third optical adjustment portion 44B are different from each other, these thicknesses need not be in descending order of thickness. For example, when refractive indexes and the like of the first optical adjustment portion 44R, the second optical adjustment portion 44G, and the third optical adjustment portion 44B are different from each other, the thicknesses of the first optical adjustment portion 44R, the second optical adjustment portion 44G, and the third optical adjustment portion 44B need not be in descending order of thickness. However, from the viewpoint of ease of manufacturing, the first optical adjustment portion 44R, the second optical adjustment portion 44G, and the third optical adjustment portion 44B may be made of the same material. Accordingly, when adopting the same material, the thicknesses of the first optical adjustment portion 44R, the second optical adjustment portion 44G, and the third optical adjustment portion 44B may be in descending order of thickness from the viewpoint of improving the color purity.

A material of the first electrode 21 and a material of the second electrode 23 may be the same, but may be different from each other. By using an optimum material for each electrode, actions required for each electrode can be sufficiently achieved. For example, in the present embodiment, the first electrode 21 may be made of ITO and the second electrode 23 may be made of IZO. Since the second electrode 23 is made of IZO, a change in optical characteristics of the second electrode 23 is suppressed even when heat is applied at the time of forming the sealing film 45 as compared to a case in which the second electrode 23 is made of ITO. In addition, ITO has a larger work function than that of IZO and facilitates hole injection into the organic layer. For this reason, ITO may be used.

Also, the display device 100 is particularly useful when the sub-pixel P0 has a pixel size of 5 $\mu m^2$ or smaller. Wearable devices such as smart glasses are required to have a minute pixel size of 5 $\mu m^2$ or smaller. For example, unlike a television, a viewing angle of smart glasses greatly changes due to a skeleton and movements of eyes of a person who uses the display device 100. Accordingly, when the display device 100 is used for smart glasses, a wider viewing angle is desirable as compared to a case in which the display device 100 is used for a television. As described above, the display device 100 is excellent in the color viewing angle and the luminance viewing angle. For this reason, by using the display device 100 of the present embodiment when the sub-pixel P0 has a pixel size of 5 $\mu m$ t or smaller, it is possible to improve performances of a device including the display device 100.

According to the display device 100 described above, it is possible to realize a wide color gamut, a wide color viewing angle, and a wide luminance viewing angle.

Figure 6:
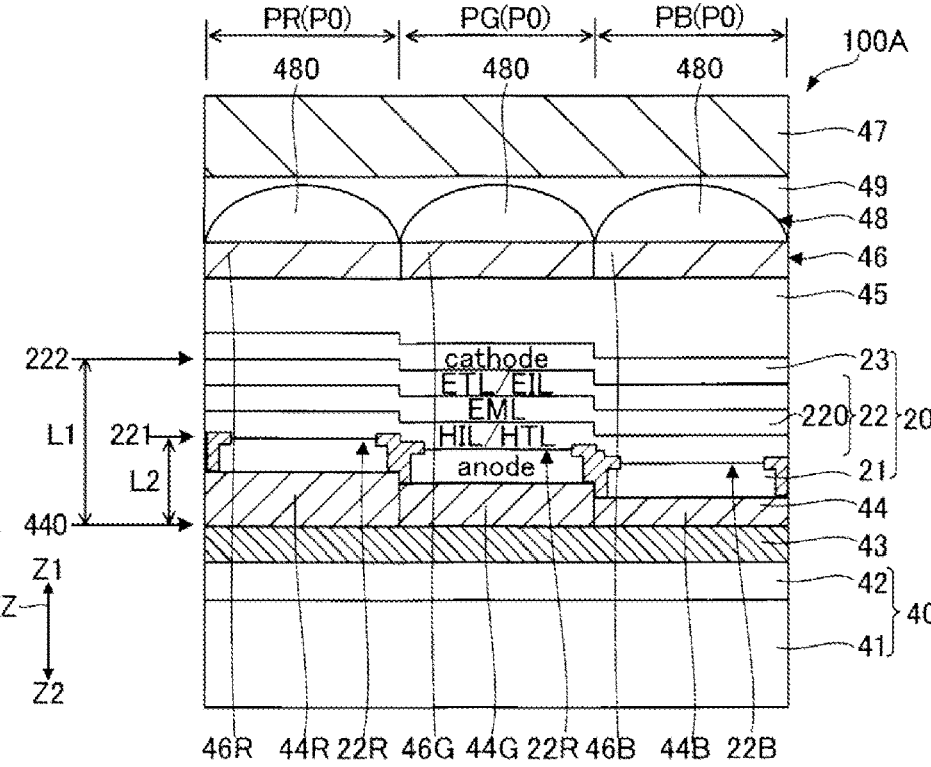
FIG. 6 is a diagram illustrating a display device of a modified example.

FIG. 6 is a diagram illustrating a display device 100A of a modified example. The display device 100A illustrated in FIG. 6 includes a lens layer 48 and a light-transmitting layer 49 in addition to the elements included in the display device 100 illustrated in FIG. 4.

The color filter 46, the lens layer 48, the light-transmitting layer 49, and the cover 47 are arranged in order. The lens layer 48 has a light transmissive property and includes a plurality of microlenses 480. The microlenses 480 are provided for each sub-pixel P0. The microlenses 480 are convex lenses protruding from the color filter 46 in the Z1 direction and have convex lens surfaces.

The light-transmitting layer 49 has a light transmissive property and is in contact with the convex lens surfaces. In the present embodiment, a refractive index of the light-transmitting layer 49 is lower than a refractive index of the lens layer 48. In this case, light transmitted through the light-transmitting layer 49 converges. For this reason, by providing the lens layer 48 and the light-transmitting layer 49, it is possible to increase luminance efficiency as compared to a case in which these layers are not provided. That is, it is possible to suppress power consumption while outputting the same luminance.

Note that the refractive index of the light-transmitting layer 49 may be higher than the refractive index of the lens layer 48. In this case, light passing through the light-transmitting layer 49 diverges. In this case, viewing angle characteristics can be improved.

According to the display device 100A described above, it is possible to realize a wide color gamut, a wide color viewing angle, and a wide luminance viewing angle while achieving high luminance efficiency.

EXAMPLES

Specific examples of the present embodiment will be described based on the following examples. Note that the present disclosure is not limited to the following examples.

Tables 1, 2, and 3 below are tables showing specific examples of the display device 100 of the present embodiment, the modified example 100A, and the like. Table 1 shows a layer configuration in the sub-pixel PR, Table 2 shows a layer configuration in the sub-pixel PG, and Table 3 shows a layer configuration in the sub-pixel PB. Note that each of Example 1, Example 2, Comparative Example 1, Comparative Example 2, Comparative Example 3, and Comparative Example 4 includes a substrate, a circuit board, a cover, and an organic layer. The substrate, the circuit board, the cover, and the organic layer are the same in all example and comparative examples, and thus description thereof will be omitted.

TABLE 1

| Red pixel | Example 1 Material | Film thickness (nm) | Example 2 Material | Film thickness (nm) | Comparative Example 1 Material | Film thickness (nm) | Comparative Example 2 Material | Film thickness (nm) | Comparative Example 3 Material | Film thickness (nm) | Comparative Example 4 Material | Film thickness (nm) |
|---|---|---|---|---|---|---|---|---|---|---|---|---|
| Lens layer | Absent | — | Present | — | Absent | — | Absent | — | Absent | — | Absent | — |
| Second electrode | IZO | 70 | IZO | 70 | IZO | 70 | IZO | 70 | MgAg | 20 | Al | 10 |
| First electrode | ITO | 20 | ITO | 20 | Al | 150 | Al | 150 | ITO | 20 | ITO | 20 |
| First optical adjustment portion on adjustment layer | SiO2 SiN SiO2 | 190 60 30 | SiO2 SiN SiO2 | 100 60 30 | — | — | — | — | SiO2 SiN SiO2 | 115 45 30 | SiO2 SiN SiO2 | 115 45 30 |
| Reflective layer | AlCu | 150 | AlCu | 150 | — | — | — | — | AlCu | 150 | AlCu | 150 |

TABLE 2

| Green pixel | Example 1 Material | Film thickness (nm) | Example 2 Material | Film thickness (nm) | Comparative Example 1 Material | Film thickness (nm) | Comparative Example 2 Material | Film thickness (nm) | Comparative Example 3 Material | Film thickness (nm) | Comparative Example 4 Material | Film thickness (nm) |
|---|---|---|---|---|---|---|---|---|---|---|---|---|
| Lens layer | Absent | — | Present | — | Absent | — | Absent | — | Absent | — | Absent | — |
| Second electrode | IZO | 70 | IZO | 70 | IZO | 70 | IZO | 70 | MgAg | 20 | Al | 10 |
| First electrode | ITO | 20 | ITO | 20 | Al | 150 | Al | 150 | ITO | 20 | ITO | 20 |
| Second optical adjustment portion on adjustment layer | SiO2 SiN SiO2 | 20 60 30 | SiO2 SiN SiO2 | 20 60 30 | — | — | — | — | SiO2 SiN SiO2 | 45 45 30 | SiO2 SiN SiO2 | 45 45 30 |
| Reflective layer | AlCu | 150 | AlCu | 150 | — | — | — | — | AlCu | 150 | AlCu | 150 |

TABLE 3

| Blue pixel | Example 1 Material | Film thickness (nm) | Example 2 Material | Film thickness (nm) | Comparative Example 1 Material | Film thickness (nm) | Comparative Example 2 Material | Film thickness (nm) | Comparative Example 3 Material | Film thickness (nm) | Comparative Example 4 Material | Film thickness (nm) |
|---|---|---|---|---|---|---|---|---|---|---|---|---|
| Lens layer | Absent | — | Present | — | Absent | — | Absent | — | Absent | — | Absent | — |
| Second electrode | IZO | 70 | IZO | 70 | IZO | 70 | IZO | 70 | MgAg | 20 | Al | 10 |
| First electrode | ITO | 20 | ITO | 20 | Al | 150 | Al | 150 | ITO | 20 | ITO | 20 |
| Third optical adjustment | SiN SiO2 | 60 30 | SiN SiO2 | 60 30 | — | — | — | — | SiN SiO2 | 45 30 | SiN SiO2 | 45 30 |

TABLE 3-continued

| Blue pixel | Example 1 | | Example 2 | | Comparative Example 1 | | Comparative Example 2 | | Comparative Example 3 | | Comparative Example 4 | |
|---|---|---|---|---|---|---|---|---|---|---|---|---|
| | Material | Film thickness (nm) | Material | Film thickness (nm) | Material | Film thickness (nm) | Material | Film thickness (nm) | Material | Film thickness (nm) | Material | Film thickness (nm) |
| portion on adjustment layer Reflective layer | AlCu | 150 | AlCu | 150 | — | — | — | — | AlCu | 150 | AlCu | 150 |

Example 1 is a specific example of the display device 100 illustrated in FIG. 4. As shown in Tables 1, 2, and 3, in each sub-pixel P0, a material of the reflective layer 43 is AlCu (aluminum-copper alloy), and the thicknesses of the reflective layer 43 is 150 nm. A material of the first electrode 21 is ITO, and the thickness of the first electrode 21 is 20 nm. A material of the second electrode 23 is IZO, and the thickness of the second electrode 23 is 70 nm. In addition, as shown in Table 1, the first optical adjustment portion 44R includes a $SiO_2$ layer having a thickness of 30 nm, a SiN layer having a thickness of 60 nm, and a $SiO_2$ layer having a thickness of 100 nm. The 30 nm-thick $SiO_2$ layer, the 60 nm-thick SiN layer, and the 100 nm-thick $SiO_2$ layer are layered in order from the reflective layer 43. As shown in Table 2, the second optical adjustment portion 44G includes a $SiO_2$ layer having a thickness of 30 nm, a SiN layer having a thickness of 60 nm, and a $SiO_2$ layer having a thickness of 20 nm. The 30 nm-thick $SiO_2$ layer, the 60 nm-thick SiN layer, and the 20 nm-thick $SiO_2$ layer are layered in order from the reflective layer 43. As shown in Table 3, the third optical adjustment portion 44B includes a $SiO_2$ layer having a thickness of 30 nm and a SiN layer having a thickness of 60 nm. The 30 nm-thick $SiO_2$ layer and the 60 nm-thick SiN layer are layered in order from the reflective layer 43.

In Example 1, the reflectance of light traveling from the organic layer 22 toward the second interface 222 is 1% or greater and 11% or less. Accordingly, in Example 1, the reflectance of the second interface 222 is 11% or less.

Example 2 is a specific example of the display device 100A illustrated in FIG. 6. Example 2 has the same configuration as that of Example 1 except that Example 2 includes the lens layer 48 and the light-transmitting layer 49.

Figure 7:
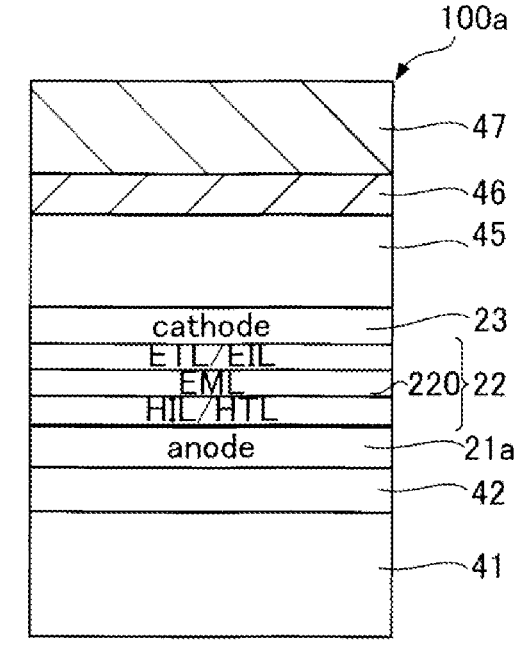
FIG. 7 is a diagram schematically illustrating a configuration of a display device of Comparative Example 1.

FIG. 7 is a diagram schematically illustrating a configuration of a display device 100a of Comparative Example 1. Note that in FIG. 7, one sub-pixel P0 is representatively illustrated. In the display device 100a illustrated in FIG. 7, the reflective layer 43 and the optical adjustment layer 44 included in the display device 100 illustrated in FIG. 4 are omitted. As illustrated in FIG. 7, the display device 100a of Comparative Example 1 includes a substrate 41, a circuit layer 42, a first electrode 21a, an organic layer 22, a second electrode 23, a sealing film 45, a color filter 46, and a cover 47. The circuit layer 42, the first electrode 21a, the organic layer 22, the second electrode 23, the sealing film 45, the color filter 46, and the cover 47 are layered in order from the substrate 41. In addition, the first electrode 21a has light reflectivity and reflects light from the light-emitting layer 220. In each sub-pixel P0, a material of the first electrode 21a is Al, and the thickness of the first electrode 21a is 150 nm. A material of the second electrode 23 is IZO, and the thickness of the second electrode 23 is 70 nm.

Figure 8:
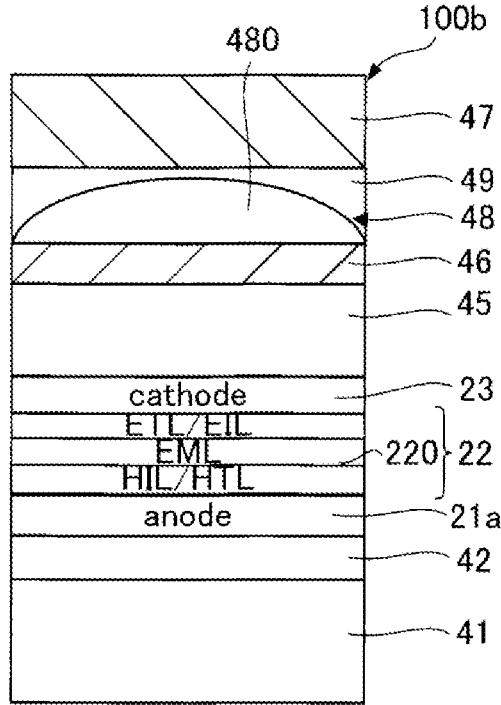
FIG. 8 is a diagram schematically illustrating a configuration of a display device of Comparative Example 2.

FIG. 8 is a diagram schematically illustrating a configuration of a display device 100b of Comparative Example 2.

Note that in FIG. 8, one sub-pixel P0 is representatively illustrated. The display device 100b of Comparative Example 2 has the same configuration as that of Comparative Example 1 except that the display device 100b of Comparative Example 2 includes the lens layer 48 and the light-transmitting layer 49.

Figure 9:
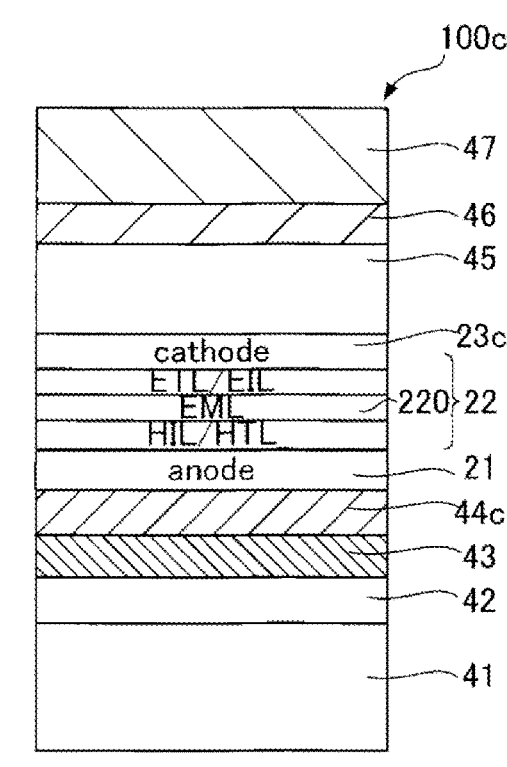
FIG. 9 is a diagram schematically illustrating a configuration of a display device of Comparative Example 3.

FIG. 9 is a diagram schematically illustrating a configuration of a display device 100c of Comparative Example 3. Note that in FIG. 9, one sub-pixel P0 is representatively illustrated. As illustrated in FIG. 9, the display device 100c includes a substrate 41, a circuit layer 42, a reflective layer 43, an adjustment layer 44c, a first electrode 21, an organic layer 22, a second electrode 23c, and a cover 47. The circuit layer 42, the reflective layer 43, the adjustment layer 44c, the first electrode 21, the organic layer 22, the second electrode 23c, and the cover 47 are layered in order from the substrate 41. The second electrode 23c is a semi-transmissive semi-reflective film that reflects and transmits light from the light-emitting layer 220. In addition, an optical resonator is formed between the second electrode 23c and the reflective layer 43. The adjustment layer 44c for each sub-pixel P0 is set to such a thickness that light in a predetermined wavelength range resonates between the second electrode 23c and the reflective layer 43. In each sub-pixel P0, a material of the reflective layer 43 is AlCu, and the thickness of the reflective layer 43 is 150 nm. Also, in each sub-pixel P0, a material of the first electrode 21 is ITO, and the thickness of the first electrode 21 is 20 nm. A material of the second electrode 23 is IZO, and the thickness of the second electrode 23 is 20 nm.

As shown in Table 1, the adjustment layer 44c provided in the sub-pixel PR includes a $SiO_2$ layer having a thickness of 30 nm, a SiN layer having a thickness of 45 nm, and a $SiO_2$ layer having a thickness of 115 nm. The 30 nm-thick $SiO_2$ layer, the 45 nm-thick SiN layer, and the 115 nm-thick $SiO_2$ layer are layered in order from the reflective layer 43. As shown in Table 2, the adjustment layer 44c provided in the sub-pixel PG includes a $SiO_2$ layer having a thickness of 30 nm, a SiN layer having a thickness of 45 nm, and a $SiO_2$ layer having a thickness of 45 nm. The 30 nm-thick $SiO_2$ layer, the 45 nm-thick SiN layer, and the 45 nm-thick $SiO_2$ layer are layered in order from the reflective layer 43. As shown in Table 3, the adjustment layer 44c provided in the sub-pixel PB includes a $SiO_2$ layer having a thickness of 30 nm and a SiN layer having a thickness of 45 nm. The 30 nm-thick $SiO_2$ layer and the 45 nm-thick SiN layer are layered in order from the reflective layer 43.

In Comparative Example 3, the reflectance of light traveling from the organic layer 22 toward the second interface 222 is 51% or greater and 58% or less. Accordingly, in Comparative Example 3, the reflectance of the second interface 222 exceeds 11%.

Comparative Example 4 is the same as Comparative Example 3 except that a material of the second electrode 23c is Al and the thickness of the second electrode 23c is 10 nm.

In Comparative Example 4, the reflectance of light traveling from the organic layer 22 toward the second interface 222 is 50% or greater and 55% or less. Accordingly, in Comparative Example 4, the reflectance of the second interface 222 exceeds 11%.

The following evaluations were performed for each of the examples and comparative examples. The evaluation results are shown in Table 4 below.

TABLE 4

| | Luminance | Color gamut (NTSC coverage rate) | | Color viewing angle | Luminance viewing |
|---|---|---|---|---|---|
| | efficiency 0 degree | 0 degree | 40 degrees | 40 degrees | angle 40 degrees |
| Example 1 | 100 | 92 | 93 | 0.013 | 0.6 |
| Example 2 | 120 | 91 | 91 | 0.018 | 0.51 |
| Comparative Example 1 | 91 | 73 | 78 | 0.01 | 0.71 |
| Comparative Example 2 | 111 | 72 | 77 | 0.013 | 0.62 |
| Comparative Example 3 | 117 | 100 | 83 | 0.025 | 0.37 |
| Comparative Example 4 | 110 | 99 | 80 | 0.034 | 0.32 |

A. Luminance Efficiency

Luminance efficiencies of Examples 1 and 2 and Comparative Examples 1 to 4 were evaluated. The luminance efficiency shown in Table 4 is a value obtained by dividing the luminance when a surface of the display device is observed in a direction of 0° by an amount of current, where a direction perpendicular to the surface of the display device is defined as 0°. Table 4 shows relative information when Example 1 is set to 100. The higher the luminance efficiency is, the more power consumption can be suppressed when outputting the same luminance.

B. Color Gamut

Color gamuts of Examples 1 and 2 and Comparative Examples 1 to 4 were evaluated. The color gamut was evaluated based on the NTSC coverage rate, which is one of color gamut standards. Also, the evaluation was performed by observing the surface of the display device in a direction of 0° and observing the surface of the display device in a direction of 40°, where the direction perpendicular to the surface of the display device was defined as 0°.

C. Color Viewing Angle

Color viewing angles of Examples 1 and 2 and Comparative Examples 1 to 4 were evaluated. A color change Δu'v' of white light when a viewing direction with respect to the display device was changed from 0° to 40° was evaluated as a color viewing angle, where the direction perpendicular to the surface of the display device was defined as 0°. A reference point of the color change is an emission color at which the surface of the display device can be observed from a direction of 0°. As a value of the color viewing angle shown in Table 4 is closer to 0, the color viewing angle is more excellent. Generally, when the value of the color viewing angle exceeds 0.02, humans perceive the colors as different. Accordingly, the value of the color viewing angle may be 0.02 or less.

D. Luminance Viewing Angle

Luminance viewing angles of Examples 1 and 2 and Comparative Examples 1 to 4 were evaluated. The luminance viewing angle was evaluated as a relative value of a change in luminance of white light when the viewing direction with respect to the display device was changed from 0° to 40°, where the direction perpendicular to the surface of the display device was defined as 0°. Table 4 shows relative values when the viewing direction is 40°, where a value when the viewing direction is 0° is set to 1.

As can be seen from Table 4, by employing the structures of Examples 1 and 2, it is possible to realize a wide color gamut, a wide color viewing angle, and a wide luminance viewing angle with an NTSC ratio of 90% or greater while achieving high luminance efficiency. In contrast, the structure of Comparative Example 1 has a low luminance efficiency and a narrow color gamut. That is, in the structure of Comparative Example 1, power consumption is high in the case of displaying the same luminance as those of the examples, and the colors that can be expressed are limited and display quality is also poor. Also, the structure of Comparative Example 2 has a high luminance efficiency, but has a narrow color gamut as in Comparative Example 1. Further, the structure of Comparative Example 3 has a high luminance efficiency when the viewing direction is 0°, but when the viewing direction is changed, the color and the luminance are greatly changed. In particular, in applications such as smart glasses, when a difference in luminance between the case in which the viewing direction is 0° and the case in which the viewing direction is 40° increases, unevenness in luminance in a screen increases.

2. Electronic Apparatus

The display device 100 of each embodiment or each modified example described above is applicable to various electronic apparatuses.

2-1. Head-Mounted Display

Figure 10:
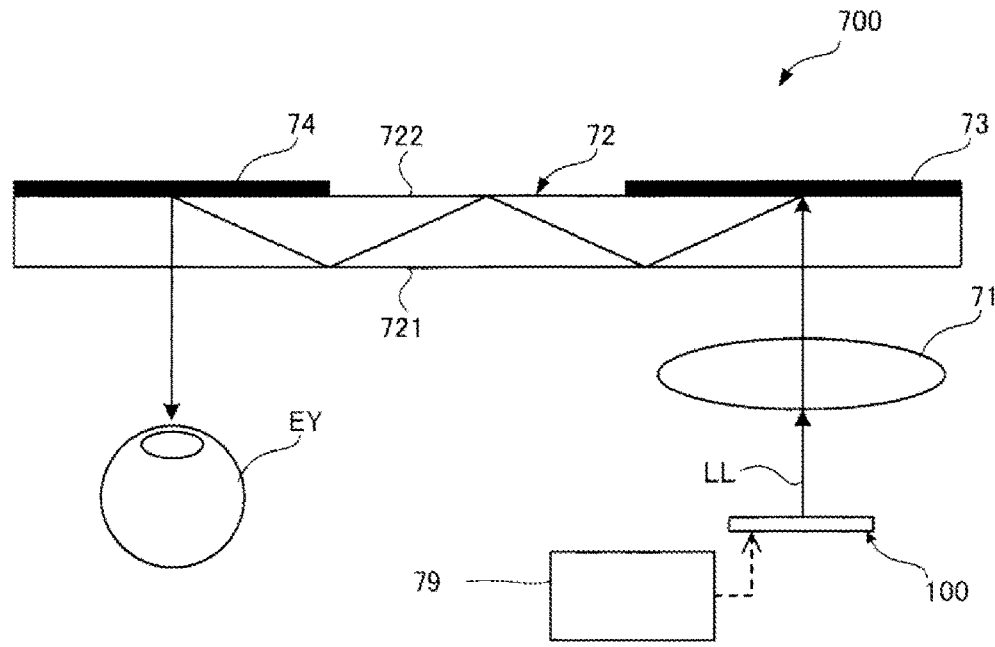
FIG. 10 is a diagram schematically illustrating a part of a virtual image display device as an example of an electronic apparatus.

FIG. 10 is a diagram schematically illustrating a part of a virtual image display device 700 as an example of an electronic apparatus. The virtual image display device 700 illustrated in FIG. 10 is a head-mounted display (HMD) worn on a head of an observer to display images. The virtual image display device 700 includes the display device 100 described above, a collimator 71, a light guide 72, a first reflection-type volume hologram 73, a second reflection-type volume hologram 74, and a control unit 79. Note that light emitted from the display device 100 is emitted as image light LL.

The control unit 79 includes, for example, a processor and a memory, and controls operations of the display device 100. The collimator 71 is disposed between the display device 100 and the light guide 72. The collimator 71 collimates light emitted from the display device 100. The collimator 71 is constituted by a collimating lens or the like. The light collimated by the collimator 71 is incident on the light guide 72.

The light guide 72 has a flat plate shape and is disposed extending in a direction intersecting a direction of light incident via the collimator 71. The light guide 72 reflects and guides light therein. A light incidence port on which light is incident and a light emission port from which light is emitted are provided in a surface 721 of the light guide 72 facing the collimator 71. The first reflection-type volume hologram 73 serving as a diffractive optical element and the second reflection-type volume hologram 74 serving as a diffractive optical element are disposed on a surface 722 of the light guide 72 opposite to the surface 721. The first reflection-type volume hologram 73 is provided closer to the light emission port side than the second reflection-type volume hologram 74. The first reflection-type volume hologram 73 and the second reflection-type volume hologram 74 have interference fringes corresponding to a predetermined wavelength range, and diffract and reflect light in the predetermined wavelength range.

In the virtual image display device 700 having such a configuration, the image light LL incident on the light guide 72 through the light incidence port travels while being repeatedly reflected, and is guided from the light emission port to an eye EY of the observer, and thus the observer can observe an image formed as a virtual image formed by the image light LL.

The virtual image display device 700 includes the above-described display device 100. In the above-described display device 100, the possibility of occurrence of capacitance variation is suppressed. For this reason, it is possible to realize a wide color gamut, a wide color viewing angle, and a wide luminance viewing angle while achieving high luminance efficiency. For this reason, the display device 100 has good quality. Therefore, by including the display device 100, the virtual image display device 700 with high display quality can be provided. Note that the same applies to a case in which the display device 100A is used instead of the display device 100.

2-2. Personal Computer

Figure 11:
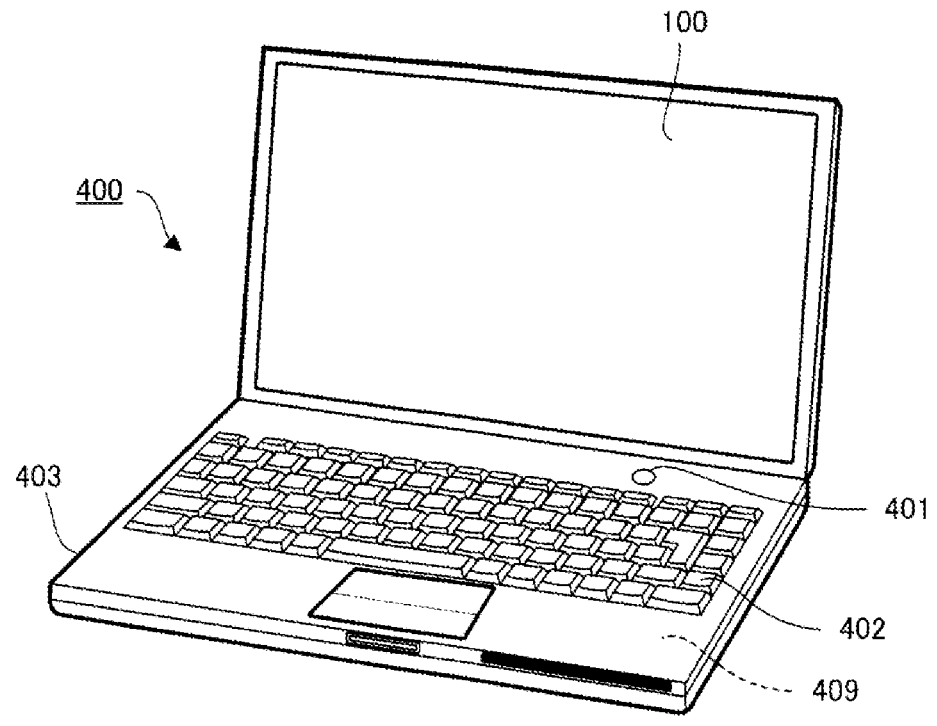
FIG. 11 is a perspective view illustrating a personal computer as an example of an electronic apparatus.

FIG. 11 is a perspective view illustrating a personal computer 400 as an example of the electronic apparatus according to the present disclosure. The personal computer 400 illustrated in FIG. 11 includes the display device 100, and a main body 403 provided with a power switch 401 and a keyboard 402, and a control unit 409. The control unit 409 includes, for example, a processor and a memory, and controls operations of the display device 100. In the personal computer 400, the above-described display device 100 can realize a wide color gamut, a wide color viewing angle, and a wide luminance viewing angle while achieving high luminance efficiency. For this reason, the display device 100 has good quality. Therefore, by including the display device 100, it is possible to provide the personal computer 400 with high display quality. Note that the same applies to a case in which the display device 100A is used instead of the display device 100.

Note that examples of the "electronic apparatus" including the display device 100 include, in addition to the virtual image display device 700 illustrated in FIG. 10 and the personal computer 400 illustrated in FIG. 11, apparatuses arranged close to eyes such as a digital scope, a digital binocular, a digital still camera, and a video camera. Further, the "electronic apparatus" including the display device 100 is applied as a mobile phone, a smartphone, a personal digital assistant (PDA), a car navigation device, and a vehicle-mounted display unit. Furthermore, the "electronic apparatus" including the display device 100 is applied as a lighting device that emits light or a sensor that uses light.

The present disclosure has been described above based on the illustrated embodiments, but the present disclosure is not limited thereto. In addition, the configuration of each component of the present disclosure may be replaced with any configuration that achieves the same functions as those of the above-described embodiments, and any configuration may be added thereto. Further, any configuration may be combined with each other in the above-described embodiments of the present disclosure.

What is claimed is:

1. A display device comprising:
an organic layer including a light-emitting layer, the light-emitting layer including an organic light-emitting material;

a reflective layer configured to reflect light generated at the light-emitting layer;
a first electrode being transparent;
a second electrode being transparent; and
an optical adjustment layer configured to adjust an optical distance between the reflective layer and the second electrode, wherein
the reflective layer, the optical adjustment layer, the first electrode, the organic layer, and the second electrode are arranged in order and
a reflectance of a first interface between the organic layer and the first electrode and a reflectance of a second interface between the organic layer and the second electrode are each 11% or less.

2. The display device according to claim 1, wherein the light generated at the light-emitting layer does not resonate between the reflective layer and the second electrode.

3. The display device according to claim 1, wherein the light emitted by the light-emitting layer constructively interferes with the light reflected by the reflective layer.

4. The display device according to claim 1, wherein a material of the first electrode and a material of the second electrode are different from each other.

5. The display device according to claim 1, wherein
a pixel of the display device includes a plurality of sub-pixels,
the first electrode is provided for each of the plurality of sub-pixels, and
the plurality of sub-pixels each has a pixel size of 5 $\mu m^2$ or smaller.

6. The display device according to claim 1, wherein
the light-emitting layer includes:
a first light-emitting portion configured to emit light in a first wavelength range,
a second light-emitting portion configured to emit light in a second wavelength range shorter than the first wavelength range, and
a third light-emitting portion configured to emit light in a third wavelength range shorter than the second wavelength range,
the optical adjustment layer includes:
a first optical adjustment portion through which the light in the first wavelength range is transmitted,
a second optical adjustment portion through which the light in the second wavelength range is transmitted, and
a third optical adjustment portion through which the light in the third wavelength range is transmitted, and
a thickness of the first optical adjustment portion, a thickness of the second optical adjustment portion, and a thickness of the third optical adjustment portion are different from each other.

7. The display device according to claim 6, wherein the thickness of the first optical adjustment portion, the thickness of the second optical adjustment portion, and the thickness of the third optical adjustment portion are in descending order of thickness.

8. An electronic apparatus comprising:
the display device according to claim 1; and
a control unit configured to control an operation of the display device.

* * * * *